United States Patent [19]

Ono

[11] Patent Number: 5,583,888
[45] Date of Patent: Dec. 10, 1996

[54] VECTOR QUANTIZATION OF A TIME SEQUENTIAL SIGNAL BY QUANTIZING AN ERROR BETWEEN SUBFRAME AND INTERPOLATED FEATURE VECTORS

[75] Inventor: Shigeru Ono, Tokyo, Japan

[73] Assignee: NEC Corporation, Tokyo, Japan

[21] Appl. No.: 304,480

[22] Filed: Sep. 12, 1994

[30] Foreign Application Priority Data

Sep. 13, 1993 [JP] Japan .................................... 5-226778

[51] Int. Cl.$^6$ .................................................. H04B 1/66
[52] U.S. Cl. .......................... 375/240; 370/521; 348/418; 375/377
[58] Field of Search .................................... 375/240, 243, 375/245, 285, 340, 346, 354, 359, 362, 371, 372; 341/106, 51; 370/98, 100.1, 105.1, 109, 110.1; 348/512, 513, 439, 418, 409; 381/29, 30, 34, 35, 39, 40; 395/2, 2.21

[56] References Cited

U.S. PATENT DOCUMENTS

| | | | |
|---|---|---|---|
| 3,810,245 | 5/1974 | Ozawa et al. | 360/127 |
| 4,821,324 | 4/1989 | Ozawa et al. | 381/31 |
| 4,833,713 | 5/1989 | Muroi et al. | 381/43 |
| 4,945,565 | 7/1990 | Ozawa et al. | 381/38 |
| 4,975,958 | 12/1990 | Hanada et al. | 381/36 |
| 5,018,200 | 5/1991 | Ozawa | 381/36 |
| 5,023,910 | 6/1991 | Thomson | 381/37 |
| 5,027,405 | 6/1991 | Ozawa | 381/35 |
| 5,029,211 | 7/1991 | Ozawa | 381/36 |
| 5,091,946 | 2/1992 | Ozawa | 381/36 |
| 5,142,548 | 8/1992 | Ozawa | 381/36 |
| 5,195,137 | 3/1993 | Swaminathan | 381/32 |
| 5,195,168 | 3/1993 | Yong | 395/2 |
| 5,208,862 | 5/1993 | Ozawa | 381/36 |
| 5,271,089 | 12/1993 | Ozawa | 395/2.31 |
| 5,347,612 | 9/1994 | Fujimoto et al. | 395/2.52 |
| 5,394,473 | 2/1995 | Davidson | 381/36 |
| 5,426,718 | 6/1995 | Funaki et al. | 395/2.25 |
| 5,479,559 | 12/1995 | Fette et al. | 395/2.16 |
| 5,487,128 | 1/1996 | Ozawa et al. | 395/2.31 |

OTHER PUBLICATIONS

Sugamura et al., "Speech Data Compression by LSP Speech Analysis–Synthesis Technique", vol. J64–A, The Transactions of the Electronics, Information, and Telecommunication Engineers of Japan, vol. J64–A, No. 8 Aug. 1981, pp. 599–606.

Wong et al., "Very Low Data Rate Speech Compression with LPC Vector and Matrix Quantization", IEEE Proceedings ICASSP, vol. ASSP-33, No. 3, Jun. 1985, pp. 537–545.

Tsao et al., "Matrix Quantizer Design for LPC Speech Using the Generalized Lloyd Algorithm", IEEE Transactions on Acoustics, Speech, and Processing, vol. ASSP-33, No. 3, Jun. 1985, pp. 537–545.

Lookabaugh et al., "High–Resolution Quantization Theory and the Vector Quantizer Advantage", IEEE Transactions on Information Theory, vol. 35, No. 5, Sep. 1989, pp. 1020–1033.

*Primary Examiner*—Wellington Chin
*Assistant Examiner*—William Luther
*Attorney, Agent, or Firm*—Foley & Lardner

[57] ABSTRACT

For quantization of subframe feature vectors representative of subframes identified by subframe indexes in each frame of a time sequential signal, such as an audio or a video signal, a first feature vector of a first subframe of a current frame is extracted with additional extraction of a second feature vector of a second subframe of the current frame and is quantized by a frame vector quantizer unit into a quantized frame vector for the current frame. Using a quantized frame vector for a previous frame and referring to interpolation coefficient vectors, an interpolator interpolates an interpolated feature vector for the current frame. An error vector is calculated between the interpolated and the second feature vectors and is quantized by an error vector quantizer unit into a quantized error vector. The subframe feature vectors are quantized by using the subframe indexes, the quantized frame vectors, the interpolated feature vector, and the quantized error vector. Preferably, the interpolation coefficient vectors are adjusted according to a mode decided for the current frame by its subframes.

20 Claims, 1 Drawing Sheet

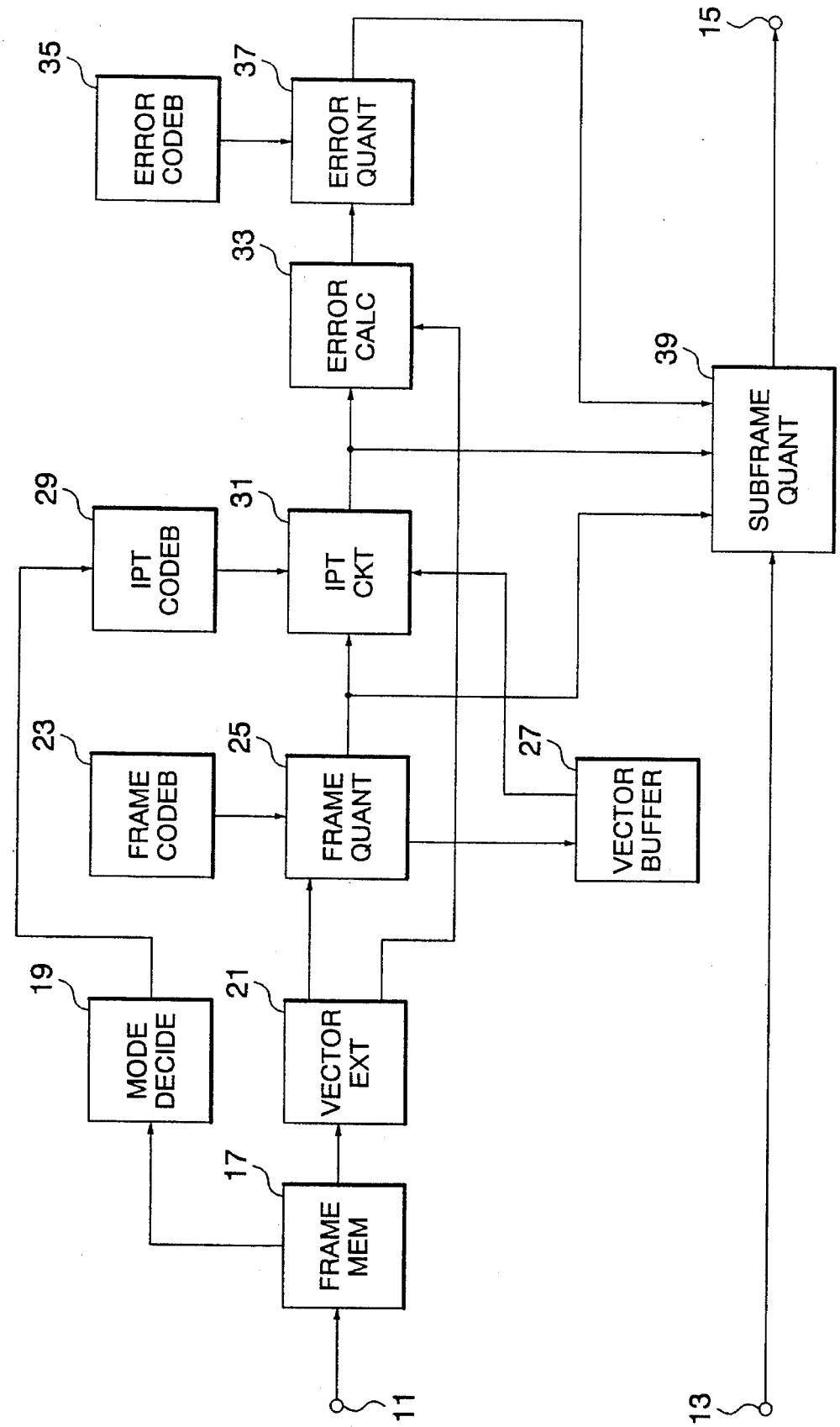

VECTOR QUANTIZATION OF A TIME SEQUENTIAL SIGNAL BY QUANTIZING AN ERROR BETWEEN SUBFRAME AND INTERPOLATED FEATURE VECTORS

BACKGROUND OF THE INVENTION

This invention relates to vector quantization at a low bit rate of a time sequential signal which is typically an audio signal or a video signal. More particularly, this invention relates to a vector quantization method and to a vector quantization device.

In such vector quantization, the time sequential signal is divided into consecutive frames. The bit rate is lowered on an average either by reducing the number of bits assigned to each frame or by using a long frame length. This invention is based on use of a long frame length.

In a conventional vector quantizing device, use of a long frame length has resulted in a deteriorated reproducibility of time sequential characteristics. The reproducibility of the time sequential characteristics is therefore raised primarily by subdivision of each frame into subframes and by calculation of feature or characteristic parameters of each subframe.

An article is contributed by Noboru Sugamura and another in the Japanese language to Densi Tûsin Gakkai Ronbunsi (the Transactions of the Electronics, Information, and Telecommunication Engineers of Japan), Volume J64-A, No. 8 (August, 1981), pages 599 to 606, under the title in translation of "Speech Data Compression by LSP Speech Analysis-Synthesis Technique". According to this Sugamura et al article, quantized subframe feature parameters are decided in connection with the subframes by linear interpolation between a quantized frame feature parameter for a current frame of the time sequential signal and another quantized frame parameter decided for a previous frame.

The reproducibility of the time sequential characteristics is raised alternatively by decision of subframe feature parameters and collective quantization of the subframe feature parameters by a matrix quantizer. In this matrix quantization, a quantized subframe feature parameter is produced for a desired subframe directly without interpolation.

An example is disclosed by D. Y. Wong, B. H. Juang, and D. Y. Cheng in a paper submitted to the IEEE ICASSP 83 and recorded in the IEEE Proceedings ICASSP, 1983, pages 65 to 68, under the title of "Very Low Data Rate Speech Compression with LPC Vector and Matrix Quantization". Another example is described in an article contributed by Chieh Tsao and Robert M. Gray to the IEEE Transactions on Acoustics, Speech, and Signal Processing, Volume ASSP-33, No. 3 (June 1985), pages 537 to 545, under the title of "Matrix Quantizer Design for LPC Speech Using the Generalized Lloyd Algorithm". In both of these examples, a vector quantization codebook is referred to on quantizing each subframe feature parameter.

In vector quantization, use of the linear interpolation results in a much deteriorated reproducibility of the time sequential characteristics when a frame includes a transition of the time sequential signal. Furthermore, the linear interpolation is not necessarily an optimum interpolation function for the feature parameters which should be subjected to interpolation.

For matrix quantization, it is possible to design various interpolation functions. Such an interpolation function, however, represents an average characteristic for each frame as a whole and is incapable of reproducing time sequential variations of the time sequential signal except for the time sequential characteristics for which the interpolation function is designed.

It is known on the other hand in theory that vector quantization has an asymptotic characteristic which is proportional to the number of bits per vector dimension. This is described in an article contributed by Tom D. Lookabaugh and Robert M. Gray to the IEEE Transactions on Information Theory, Volume 35, No. 5 (September 1989), pages 1020 to 1033, under the title of "High-Resolution Quantization Theory and the Vector Quantizer Advantage".

It follows therefore when the matrix quantization is resorted to that the time sequential characteristics are more degraded than those achieved by the linear interpolation when a small number of bits are used per vector dimension with each frame subdivided into a great number of subframes. When this great number of subframes is applied to the vector quantization with the number of vector dimensions increased, design of the interpolation function gives rise to similar problems as in the matrix quantization.

In the meantime, a prior United States patent application was filed Feb. 9, 1994, under Ser. No. 193,596 by Kazunori Ozawa, assignor to the present assignee. In accordance with this copending Ozawa patent application, each frame of a voice or speech signal has a long frame length which is typically 40 milliseconds long. Each frame is subdivided into a plurality of subframes, such as first through fifth subframes. Line spectrum pairs (LSP) are extracted as subframe feature parameters from only at least one subframe, such as the fifth subframe, of each frame. For others of the subframes, such feature parameters are interpolated with reference to an interpolation codebook, which is trained. The subframe feature parameters are quantized by using at least two vector quantization codebooks. It should be noted that the present invention of the instant inventor is similar in respects of use of a long frame length, a plurality of subframes, extraction of subframe feature parameter vectors from at least two subframes of each frame, vector quantization codebooks, and an interpolation codebook.

SUMMARY OF THE INVENTION

In view of the foregoing, it is an object of the present invention to implement vector quantization of a time sequential signal into quantized subframe feature vectors with a low bit rate.

It is another object of this invention to implement vector quantization which is of the type described and which can faithfully follow time sequential variations of the signal.

It is still another object of this invention to implement vector quantization which is of the type described and which exploit long-term interpolation characteristics of the signal.

It is yet another object of this invention to implement vector quantization which is of the type described and in which quantized is an error or difference between a subframe feature vector of a subframe of the time sequential signal and a subframe feature vector interpolated for the subframe in accordance with the long-term interpolation characteristics.

It is a further object of this invention to implement vector quantization which is of the type described and in which an interpolated frame vector is calculated based on interpolation coefficient vectors decided by the long-term interpolation characteristics.

It is a still further object of this invention to implement vector quantization which is of the type described and in which a local characteristic of each frame is divided into interpolation coefficient vectors and the error.

It is a yet further object of this invention to implement vector quantization which is of the type described and which requires a less memory capacity and a less amount of calculation than matrix quantization of quantizing feature vector of all subframes of consecutive frames.

It is a subordinate object of this invention to implement vector quantization which is of the type described and in which the interpolation coefficient vectors are switched in accordance with a principal mode of a current frame of the time sequential signal.

Other objects of this invention will become clear as the description proceeds.

In accordance with an aspect of this invention, there is provided a vector quantizing method of vector quantizing a time sequential signal divided into consecutive frames, each comprising a plurality of subframes identified by subframe indexes, which method comprises the steps of: (A) extracting first and second feature vectors at least from first and second subframes of a current frame of the time sequential signal; (B) calculating a quantized frame vector for the current frame by using the first feature vector; (C) interpolating an interpolated feature vector for the current frame based on interpolation coefficient vectors between the quantized frame vector and another quantized frame vector calculated for a previous frame which is at least one frame prior to the current frame; (D) calculating an error between the second feature vector and the interpolated feature vector as an error feature vector; (E) quantizing the error feature vector into a quantized error vector; and (F) producing quantized subframe vectors for the plurality of subframes by using the subframe indexes, the quantized frame vector for the current frame, the interpolated feature vector, and the quantized error vector.

In accordance with a different aspect of this invention, there is provided a vector quantizing device which is for vector quantizing a time sequential signal divided into consecutive frames, each comprising a plurality of subframes identified by subframe indexes, and which comprises: (A) extracting means for extracting first and second feature vectors at least from first and second subframes of a current frame of the time sequential signal; (B) frame vector calculating means for calculating a quantized frame vector for the current frame by using the first feature vector; (C) interpolating means for interpolating an interpolated feature vector for the current frame based on interpolation coefficient vectors between the quantized frame vector and another quantized frame vector calculated for a pervious frame which is at least one frame prior to the current frame; (D) error calculating means for calculating an error between the second feature vector and the interpolated feature vector as an error feature vector; (E) error quantizing means for quantizing the error feature vector into a quantized error vector; and (F) quantized subframe vector calculating means for calculating quantized subframe vectors for the plurality of subframes by using the subframe indexes, the quantized frame vector for the current frame, the interpolated feature vector, and the quantized error vector.

BRIEF DESCRIPTION OF THE DRAWING:

The sole FIGURE is a block diagram of a vector quantizing device according to an embodiment of the instant invention.

DESCRIPTION OF THE PREFERRED EMBODIMENT:

Referring to the single FIGURE, the description will be directed to a vector quantizing device according to a preferred embodiment of the present invention. The vector quantizing device is for vector quantizing a time sequential signal which is, for example, either an audio or speech signal or a video or picture signal, and is divisible into consecutive frames of a common frame length or period.

Each frame comprises a plurality of subframes which have a common subframe length and are identified by first through N-th subframe indexes 1sb to Nsb, where N represents an integer which is equal at least to two and is typically equal to five in the manner exemplified heretobefore. With the subframe indexes either singly or collectively denoted by nsb, each subframe will be referred to as an nsb-th subframe. Similarly, the frames will be identified by a frame number m, where m represents a natural number. It is possible to subdivide each frame into the subframes as by segmentation known in the art.

The vector quantizing device has a signal input terminal 11 supplied with the time sequential signal as a device input signal, an index input terminal 13 supplied with the subframe indexes, such as nsb in synchronism with the nsb-th subframe, and a device output terminal 15 to which the vector quantizing device supplies as a device output signal sequentially with quantized subframe feature parameter vectors as results of vector quantization of the successive subframes of the consecutive frames. Merely for brevity of the description, such a feature parameter vector is herein referred to as a feature vector. When quantized, the feature vector is briefly called a quantized vector.

Delivered from the signal input terminal 11, the time sequential signal is temporarily stored in a frame memory (FRAME MEM) 17 according to the subframes. Stored in the frame memory 17 with subdivision into the subframes, the time sequential signal is accessed by a frame mode deciding circuit (MODE DECIDE) 19 for deciding a fundamental mode of each frame in accordance with a predetermined algorithm which will presently be exemplified. The fundamental mode is typically one first through third modes mode(1), mode(2), and mode(3) indicating that the time sequential signal builds up, is stationary, and builds down in the frame under consideration.

The predetermined algorithm may refer to root mean squares rms(nsb) of the nsb-th subframes of each frame. More particularly, it will be presumed that the subframes of each frame are at least three in number and are 1sb-th, 2sb-th, (N−1)sb-th, and Nsb-th subframes, where (N−1) may be equal to two. Under the circumstances, a quotient is calculated by dividing a product of the root mean squares for two trailing ones of the subframes, namely, $$rms((N-1)sb)rms(Nsb)$$

by another product of the root mean squares for two leading ones of the subframes, namely, $$rms(1sb)rms(2sb)$$

When the quotient is equal to or less than 0.5, is between 0.5 and 2.0, both exclusive, and is equal to or greater than 2.0, the fundamental mode is decided as mode(3), mode(2), and mode(1), respectively.

The predetermined algorithm may alternatively refer to an average adaptive codebook predictive gain PG of each frame. In preparation for calculation of the average predictive gain, the time sequential signal of each frame will be represented by s(m). In the nsb-th subframe, samples of the time sequential signal are denoted by s(nsb, isp), where isp in a joint argument of nsb and isp represents an isp-th sample of 1sp-th through Isp-th samples. A k'-th order autocorrelation coefficient ccr(k', nsb) of the nsb-th subframe and a k'-th order crosscorrelation coefficient crs(k', nsb) are calculated as follows.

$$crs(k',nsb) = \sum_{isp=1}^{Isp} [s(nsb,isp + \text{bias}) \times s(nsb,isp - k + \text{bias})],$$

and $$crr(k',nsb) = \sum_{isp} s^2(nsb,isp - k + \text{bias}),$$

where:

$$s(nsb, isp) = s(isp + \text{bias})$$

and $$\text{bias} = (nsb-1) \times Isp + 1$$

Using the power spw(nsb) of the nsb-th subframe, namely:

$$spw(nsb) = \sum_{isp} s^2(nsb,isp),$$

a k-th order predictive gain PG(k, nsb) of the nsb-th subframe is calculated by:

$$PG(k,nsb) = spw(nsb)/[spw(nsb) - crs^2(nsb,isp)/crr^2(nsb,isp)].$$

By finding a maximum of the k-th order nsb-th subframe predictive gain, lags {lag(nsb)} are calculated for the 1sb-th through the Nsb-th subframes. The average predictive gain is now given by:

$$PG = \sum_{nsb} spw(nsb)/ \sum_{nsb} [spw(nsb) - crs^2(lag(nsb))/crr^2(lag(nsb))].$$

Calculating a logarithm of the average predictive gain, the fundamental mode is decided as mode(3), mode(2), and mode(1) when the average predictive gain is higher than 10.0 dB, is lower than 10.0 dB and higher than 5.0 dB, and is lower than 5.0 dB and higher than 2.0 dB. If the average predictive gain is lower than 2.0 dB, the frame in question is aperiodic.

Stored in the frame memory 17 in the manner described before, the time sequential signal is accessed furthermore by a subframe feature vector extractor (VECTOR EXT) 21. Within each frame length of a current frame identified by a current frame number M in the time sequential signal, the subframe feature vector extractor 21 specifies at least first and second subframes. It will be presumed merely for brevity of the description that the Nsb-th subframe is specified as the first subframe with the index Nsb used as a first index and with one of the other subframes specified as the second subframe and that the second subframe is identified by a second index Nnd which is variable between 1sb, inclusive, and Nsb, exclusive.

Analyzing the samples of the subframes including the first subframe at their center, the subframe feature vector extractor 21 extracts a predetermined number of line spectrum pair (LSP) parameters as vector components of a first feature vector {f(M, Nsb)}, where f indicates a vector component with a joint argument (M, Nsb) used to identify the first subframe, here the Nsb-th subframe, of the current frame M. Similarly, a second feature vector {f(M, Nnd)} is extracted from the second subframe.

A frame vector quantization codebook (FRAME CODEB) 23 is used as a vector quantization codebook and is preliminarily loaded with a first preselected number Kc of frame vector quantization code vectors c(k), where k now represents a quantization code vector index variable from 1 up to the first preselected number which may be, for example, equal to 128 or 256. Supplied with the first feature vector from the subframe feature vector extractor 21, a frame vector quantizer (FRAME QUANT) 25 refers to the frame vector quantization codebook 23 to locate a quantized current frame vector {f(M)} for the current frame by a minimum of squares of a difference between the first feature vector and each of the frame vector quantization code vectors:

$$[f(M, Nsb) - c(k)]^2 \tag{1}$$

Calculated successively in connection with the consecutive frames, such quantized frame vectors are stored in a quantized frame vector buffer (VECTOR BUFFER) 27 as quantized previous frame vectors at addresses specified by the frame numbers m up to the current frame number M. On the other hand, an interpolation coefficient codebook (IPT CODEB) 29 is used as an interpolation codebook keeping interpolation coefficient vectors β(m') for the current frame and for previous frames (M-m'), where m' is variable between zero and a prescribed integer Tp which may be two or three.

Decided by the frame mode deciding circuit 19 successively as regards the previous and the current frames, the fundamental modes are used to train the interpolation coefficient vectors in the interpolation coefficient vector codebook 29. Supplied from the frame vector quantizer 25 with the quantized frame vector and from the quantized frame vector buffer 27 with the quantized previous frame vectors, an interpolating circuit (IPT CKT) 31 calculates an interpolated feature vector {f(M, itp)} for the current frame by:

$$\sum_{m'=0}^{Tp} \beta(m')\hat{f}(M - m').$$

In practice, the interpolated feature vector is calculated for individual subframe of the current frame.

Supplied from the subframe feature vector extractor 21 with the second feature vector and from the interpolating circuit 31 with the interpolated feature vector which may be interpolated for the current frame as a whole, an error vector calculator (ERROR CALC) 33 calculates an error vector {f(M, e)} for the second subframe by subtracting the interpolated feature vector from the second feature vector. An error vector quantization codebook (ERROR CODEB) 35 is another vector quantization codebook preliminarily loaded with a second preselected number Kp of quantized error code vectors c(p) for the current frame, where p represents an error code vector index variable from one up to the second preselected number which may be equal to sixteen.

Supplied with the error vector from the error calculator 33, an error vector quantizer (ERROR QUANT) 37 refers to the error vector quantization codebook 35 to quantize the error vector into a quantized error vector {f̂(M, e)}. Like the quantized frame vector located by the frame vector quantizer 25, the quantized error vector is given by one of the quantized error code vectors that minimizes squares of a difference between the error vector and each of the quantized error code vectors, namely:

$$[f(M, e) - c(p)]^2 \tag{2}$$

A subframe feature vector quantizer (SUBFRAME QUANT) 39 is now supplied from the index input terminal 13 with the subframe indexes, from the frame vector quantizer 25 with the quantized current frame vector, from the interpolating circuit 31 with the interpolated feature vector, and from the error vector quantizer 37 with the quantized error vector. The interpolated feature vector need not be quantized. In practice, use is additionally made of a quantized frame vector produced for an immediately preceding frame of a frame number (M−1).

Using the interpolated feature vector and the quantized error vector, the subframe feature vector quantizer 39 first calculates a quantized second feature vector $\{\hat{f}(Nnd)\}$ by a vector sum of the interpolated feature vector $\{f(M, itp)\}$ and the quantized error vector $\{\hat{f}(M, e)\}$. Using the quantized second feature vector and for delivering to the device output terminal 15, the subframe feature vector quantizer 39 subsequently calculates quantized subframe feature vectors $\{\hat{f}(M, nsb)\}$ for the 1sb-th through the Nsb-th subframes of the current frame as follows, where only one of the vector components $\hat{f}(M, nsb)$ is taken into account.

If the subframe index nsb is equal to or greater than one and is equal to or less than the second index Nnd:

$$\hat{f}(m,nsb) = (Nsb - nsb)\hat{f}(M - 1)/Nnd + nsb\hat{f}(M,Nnd)/Nnd.$$

If the subframe index nsb is equal to or greater than the second index Nnd plus one and is equal to or less than the first index Nsb:

$$\hat{f}(M,nsb) = (Nsb - nsb)\hat{f}(M,Nnd)/(Nsb - Nnd) +$$

$$(nsb - Nnd)\hat{f}(M)/(Nsb - Nnd).$$

Reviewing the sole figure, the vector quantizing device deals with a time sequential signal, such as an audio or a video signal, divided into consecutive frames, each comprising a plurality of subframes identified by subframe indexes, respectively. In the vector quantizing device, fundamental frame mode deciding means (19) decides a fundamental frame mode of each frame in compliance with a predetermined algorithm, such as reference to root mean squares of the subframes of the frame under consideration or reference to an average predictive gain of the frame. Subframe feature vector extracting means (21) extracts first and second feature vectors at least from first and second subframes of a current frame of the time sequential signal.

Quantized frame vector calculating means (25, 27) uses a predetermined one of the first and the second feature vectors, such as the first feature vector, in calculating a quantized current frame vector for the current frame. Based on interpolation coefficient vectors decided in compliance with the fundamental mode of the current frame, interpolating means (27, 29, 31) interpolates an interpolated current frame feature vector for the current frame between the quantized current frame vector and a quantized previous frame vector calculated by the quantized frame vector calculating means for a previous frame which is at least one frame prior to the current frame.

Error vector calculating means (33) calculates an error vector between the second feature vector and the interpolated current frame feature vector. Error vector quantizing means (35, 37) quantizes the error feature vector into a quantized error vector. Quantized subframe vector calculating means (39) eventually calculates or produces quantized subframe vectors for the plurality of subframes of the current frame by using the subframe indexes, the quantized current frame vector, the interpolated current frame feature vector, and the quantized error vector.

In vector quantization thus far described, it is possible to substitute linear interpolation coefficients for the interpolation coefficient vectors. It is possible to variably decide the second subframe in the current frame depending on characteristics of the consecutive frames. For example, it will be surmised that the mode deciding circuit 19 finds that the time sequential signal builds up in a particular frame. In such a case, the second index Nnd is preferably selected nearer to the first index Nsb.

It is furthermore possible to use a plurality of frame vector quantization codebooks, such as 23, on quantizing the frame feature vector into the quantized frame vector and a plurality of error quantization codebooks, such as 35, on quantizing the error vector into the quantized error vector. In such an event, one of the frame vector quantization codebooks is selected at a time based on the fundamental modes of the frames, from which the quantized frame vector should be produced. One of the error quantization codebooks may be selected based on the second feature vector delivered from the subframe feature vector extractor 21.

It is additionally possible to make the frame vector quantizer 25 produce a plurality of quantized frame vectors for the first feature vector. In this event, the error calculator 33 produces as many error vectors as the quantized frame vectors. One of the error vectors is selected at the error calculator 33 that minimizes a sum of the minimum of Formula (1) and the minimum of Formula (2).

Incidentally, it is possible to make the mode deciding circuit 19 store therein the modes decided in connection with the consecutive frames up to the current frame.

What is claimed is:

1. A vector quantizing method of vector quantizing a time sequential signal divided into consecutive frames, each comprising a plurality of subframes identified by subframe indexes, comprising the steps of:

extracting first and second feature vectors at least from first and second subframes of a current frame of said time sequential signal;

calculating a quantized frame vector for said current frame by using said first feature vector;

interpolating an interpolated feature vector for said current frame based on interpolation coefficient vectors between said quantized frame vector and another quantized frame vector calculated for a previous frame which is at least one frame prior to said current frame;

calculating an error between said second feature vector and said interpolated feature vector as an error feature vector;

quantizing said error feature vector into a quantized error vector; and producing quantized subframe vectors for said plurality of subframes by using said subframe indexes, the quantized frame vector for said current frame, said interpolated feature vector, and said quantized error vector.

2. A vector quantizing method as claimed in claim 1, further comprising the steps of:

deciding a fundamental mode of each frame by using the subframes of said each frame; and deciding said interpolation coefficient vectors by the fundamental mode of said current frame.

3. A vector quantizing method as claimed in claim 2, wherein said fundamental mode represents whether said time sequential signal builds up, is stationary, or builds down in said current frame.

4. A vector quantizing device for vector quantizing a time sequential signal divided into consecutive frames, each comprising a plurality of subframes identified by subframe indexes, said vector quantizing device comprising:

extracting means for extracting first and second feature vectors at least from first and second subframes of a current frame of said time sequential signal;

frame vector calculating means for calculating a quantized frame vector for said current frame by using said first feature vector;

interpolating means for interpolating an interpolated feature vector for said current frame based on interpolation coefficient vectors between said quantized frame vector and another quantized frame vector calculated for a previous frame which is at least one frame prior to said current frame;

error calculating means for calculating an error between said second feature vector and said interpolated feature vector as an error feature vector;

error quantizing means for quantizing said error feature vector into a quantized error vector; and quantized subframe vector calculating means for calculating quantized subframe vectors for said plurality of subframes by using said subframe indexes, the quantized frame vector for said current frame, said interpolated feature vector, and said quantized error vector.

5. A vector quantizing device as claimed in claim 4, further comprising fundamental frame mode deciding means for deciding a fundamental mode of said current frame by using the subframes of said current frame.

6. A vector quantizing device as claimed in claim 5, wherein said fundamental mode represents whether said time sequential signal builds up, is stationary, or builds down in said current frame.

7. A vector quantizing device as claimed in claim 6, wherein said fundamental frame mode deciding means calculates a quotient of a product of root mean squares of two trailing ones of the subframes of said current frame divided by another product of root mean squares of two leading ones of the subframes of said current frame to decide that said fundamental mode represents said build up, said stationary state, for said build down of said time sequential signal in said current frame when said quotient is not greater than 0.5, is between 0.5 and 2.0, both inclusive, or is not less than 2.0, respectively.

8. A vector quantizing device as claimed in claim 6, wherein said fundamental frame mode deciding means calculates an average adaptive predictive gain of said current frame to decide that said fundamental mode represents said build up, said stationary state, or said build down of said time sequential signal in said current frame when said predictive gain is greater than 10.0 dB, is between 10 dB and 5.0 dB, or is between 5.0 dB and 2.0 dB, respectively.

9. A vector quantizing device as claimed in claim 5, wherein said interpolating means comprises:

a quantized frame vector buffer for storing therein, as stored frame vectors, quantized frame vectors calculated for frames preceding said current frame;

an interpolation codebook keeping a prescribed number of code vectors as said interpolation coefficient vectors; and an interpolating circuit for interpolating said interpolated feature vector with reference to said code vectors between the quantized frame vector for said current frame and at least one of said stored frame vectors.

10. A vector quantizing device as claimed in claim 9, wherein said fundamental mode represents whether said time sequential signal builds up, is stationary, or builds down in said current frame.

11. A vector quantizing device as claimed in claim 10, wherein said interpolation codebook is trained in response to the fundamental modes of previous frames preceding said current frame.

12. A vector quantizing device as claimed in claim 10, wherein said fundamental frame mode deciding means calculates a quotient of a product of root mean squares of two trailing ones of the subframes of said current frame divided by another product of root mean squares of two leading ones of the subframes of said current frame to decide that said fundamental mode represents said build up, said stationary state, or said build down of said time sequential signal in said current frame when said quotient is not greater than 0.5, is between 0.5 and 2.0, both inclusive, or is not less than 2.0, respectively.

13. A vector quantizing device as claimed in claim 10, wherein said fundamental frame mode deciding means calculates an average adaptive predictive gain of said current frame to decide that said fundamental mode represents said build up, said stationary state, or said build down of said time sequential signal in said current frame when said predictive gain is greater than 10.0 dB, is between 10.0 dB and 5.0 dB, or is between 5.0 dB and 2.0 dB, respectively.

14. A vector quantizing device as claimed in claim 4, wherein said frame vector calculating means comprises:

a vector quantization codebook keeping a preselected number of frame vector quantization code vectors; and a frame vector quantizer for quantizing said current frame into the quantized frame vector for said current frame by selecting one of said frame vector quantization code vectors that minimizes a square of a difference between said first feature vector and said one of frame vector quantization code vector.

15. A vector quantizing device as claimed in claim 14, further comprising fundamental frame mode deciding means for deciding a fundamental mode of said current frame by using the subframes of said current frame, said fundamental mode representing whether said time sequential signal builds up, is stationary, or builds down in said current frame.

16. A vector quantizing device as claimed in claim 15, wherein said interpolating means comprises:

a quantized frame vector buffer for storing therein, as stored frame vectors, quantized frame vectors calculated for previous frames preceding said current frame;

an interpolation codebook trained in response to the fundamental modes of said previous frames to keep a prescribed number of code vectors as said interpolation code vectors; and an interpolating circuit for interpolating said interpolated feature vector with use of said code vectors between the quantized frame vector for said current frame and at least one of said stored frame vectors.

17. A vector quantizing device as claimed in claim 4, wherein said error quantizing means comprises:

a vector quantization codebook keeping a preselected number of quantized error code vectors for said current frame; and an error vector quantizer for quantizing said error feature vector into said quantized error vector by selecting one of said quantized error code vectors as said quantized error vector that minimizes a square of a difference between said error vector and said one of quantized error feature code vectors.

18. A vector quantizing device as claimed in claim 17, further comprising fundamental frame mode deciding means for deciding a fundamental mode of said current frame by using one of said plurality of subframes of said current frame, said fundamental mode representing whether said time sequential signal builds up, is stationary, or builds down in said current frame.

19. A vector quantizing device as claimed in claim 18, wherein said interpolating means comprises:

- a quantized frame vector buffer for storing therein, as stored frame vectors, quantized frame vectors calculated for previous frames preceding said current frame;
- an interpolation codebook trained in response to the fundamental modes of said previous frame to keep a prescribed number of code vectors as said interpolation coefficient vectors; and
- an interpolating circuit for interpolating said interpolated feature vector with use of said stored code vectors between the quantized frame vector for said current frame and at least one of said stored frame vectors.

20. A vector quantizing device as claimed in claim 4, wherein said current frame being identified by a frame number M and next following a preceding frame of another frame number (M−1), where M represents an integer which depends on said current frame in said time sequential signal and is equal at least to two, said error quantizing means producing an (M−1)-th quantized error vector $\{\hat{f}(M-1)\}$ for said preceding frame and an M-th quantized error vector $\{\hat{f}(M)\}$ for said current frame, where f represents one of vector components, a hat over f indicating that the vector component is a component of a quantized vector, arguments (M−1) and M representing that the vector components are components of (M−1)-th and M-th quantized vectors, said subframe indexes being represented for each frame in general by nsb, where n is variable between 1 and N so that the subframe indexes are variable between 1sb and Nsb with N made to represent a predetermined integer decided by said plurality, said first subframe being identified by the subframe index Nsb, said second subframe being identified by a subframe index Nnd, where Nnd represents one of the subframe indexes between 1sb and (N−1)sb, wherein said quantized subframe vector calculating means first calculates a vector sum of said interpolated feature vector and said quantized error vector as a quantized feature vector $\{\hat{f}(M, Nnd)\}$ for the second subframe of said current frame and subsequently calculates said quantized subframe vectors with each vector component of an nsb-th vector of the quantized subframe vectors of said current frame calculated:

for the subframe index nsb between 1sb and Nnd, both inclusive, by:

$$(Nnd - nsb)\hat{f}(M - 1)/Nnd + nsb\hat{f}(M,Nnd)/Nnd;$$

and for the subframe indexes nsb between Nnd plus one and Nsb, both inclusive, by:

$$(Nsb - nsb)\hat{f}(M,Nnd)/(Nsb - Nnd) + (nsb - Nnd)\hat{f}(M)/(Nsb - Nnd).$$

* * * * *